United States Patent

Wu

[11] Patent Number: 5,543,362
[45] Date of Patent: Aug. 6, 1996

[54] PROCESS FOR FABRICATING REFRACTORY-METAL SILICIDE LAYERS IN A SEMICONDUCTOR DEVICE

[75] Inventor: Wei E. Wu, Austin, Tex.

[73] Assignee: Motorola, Inc., Schaumburg, Ill.

[21] Appl. No.: 413,037

[22] Filed: Mar. 28, 1995

[51] Int. Cl.$^6$ ............................................. H01L 21/28
[52] U.S. Cl. ........................ 437/200; 437/190; 437/193; 437/41
[58] Field of Search ................................. 437/200, 201, 437/190, 193, 192, 41; 257/377, 755, 756, 757

[56] References Cited

U.S. PATENT DOCUMENTS

| | | | |
|---|---|---|---|
| 4,935,380 | 6/1990 | Okumura | 437/200 |
| 4,960,732 | 10/1990 | Dixit et al. | 437/200 |
| 4,978,637 | 12/1990 | Liou et al. | 437/200 |
| 5,164,333 | 11/1992 | Schwalke et al. | 437/193 |
| 5,172,211 | 12/1992 | Godinho et al. | 257/536 |
| 5,244,826 | 9/1993 | Gonzalez et al. | 437/60 |
| 5,268,590 | 12/1993 | Pfiester et al. | 257/764 |
| 5,332,692 | 7/1994 | Saitoh | 437/200 |
| 5,451,545 | 9/1995 | Ramaswami et al. | 437/200 |
| 5,461,005 | 10/1995 | Manocha et al. | 437/200 |

FOREIGN PATENT DOCUMENTS

| | | | |
|---|---|---|---|
| 0 337 481 | 10/1989 | European Pat. Off. | H01L 29/60 |
| 61-150376 | 7/1986 | Japan . | |
| 62-139343 | 6/1987 | Japan . | |
| 63-050042 | 3/1988 | Japan . | |
| 01205468 | 8/1989 | Japan . | |

OTHER PUBLICATIONS

S. Kanamori et al., "Suppression of Platinum Penetration Failure in Ti/Pt/Au Beam Lead Metal Systems Using a TiN Diffusion Barrier", Electronics and Optics, Thin Solid Films, 110 (1983), pp. 205–213.

T. Iijima et al., "A novel selective Ni3Si contact plug technique for deep–submicron ULSIs", 1992 Symposium on VLSI Tech. Digest of Technical Papers, pp. 70–71.

Chin–An Chang et al., "Reaction between Cu and TiSi2 across different barrier layers", 1990 American Institute of Physics, Appl. Phys, Lett. 57 (6), 6 Aug. 1990, pp. 617–619.

Primary Examiner—George Fourson
Assistant Examiner—Thomas G. Bilodeau
Attorney, Agent, or Firm—Jasper W. Dockrey

[57] ABSTRACT

A process for fabricating refractory-metal silicide layers in a semiconductor device includes the formation of a composite gate electrode (54) and a buried contact structure (56). The composite gate electrode (54) includes a refractory-metal silicide layer (52) separated from a first polycrystalline silicon layer (38) by a diffusion barrier layer (46). The buried contact structure (56) includes a refractory-metal silicide layer (52) separated from a buried contact region (44) of a semiconductor substrate (30) by the diffusion barrier layer (46). The refractor-metal silicide layer (52) is formed by inverting a second polycrystalline silicon layer (48) to a refractory-metal silicide material while preventing the diffusion of refractory-metal atoms into underlying silicon regions.

8 Claims, 3 Drawing Sheets

PROCESS FOR FABRICATING REFRACTORY-METAL SILICIDE LAYERS IN A SEMICONDUCTOR DEVICE

CROSS-REFERENCE TO RELATED APPLICATION

Related subject matter is disclosed in co-pending, commonly-assigned patent application entitled "Nonvolatile Memory Device Having An Encapsulated Floating-Gate Electrode And Process" having Ser. No. 08 /300,893 filed Sep. 6, 1994.

FIELD OF THE INVENTION

This invention relates, in general, to a method for fabricating a semiconductor device, and more particularly, to a method for fabricating an

BACKGROUND OF THE INVENTION

As the demand for high-performance integrated circuits continues to grow, the use of materials having high electrical conductivity also increases. The most commonly used material for gate electrodes, capacitor plates, and many types of interconnects is polycrystalline silicon. However, since polycrystalline silicon is a semiconductor material, its intrinsic state is not highly conductive. The electrical conductivity of polycrystalline silicon can be increased by doping the polycrystalline silicon with a conductivity determining dope, such as boron, phosphorus, or arsenic. However, once the polycrystalline silicon is saturated with a dopant, a further increase in electrical conductance can not be obtained. Other materials, such as pure metals, have a very high electrical conductivity, but have not been widely used in metal-oxide-semiconductor (MOS) technology, in part, because they do not form a satisfactory interface with silicon dioxide.

To overcome the interface limitations encountered with pure metals, high-performance integrated circuits requiring very low electrical resistance leads employ an alloy of polycrystalline silicon and a refractory-metal. This material is known as a refractory-metal silicide. The silicide material is fabricated in such a way as to maintain the superior interface characteristics of polycrystalline silicon and silicon dioxide, while achieving low electrical resistance through the incorporation of a refractory-metal.

A common method for fabricating a refractory-metal silicide material is to first form a polycrystalline silicon layer, then deposit a refractory-metal layer onto the polycrystalline silicon layer. The refractory-metal layer can be deposited onto a silicon substrate also. After depositing the refractory-metal layer, the layers are heated to a high temperature and the refractory-metal diffuses into the polycrystalline silicon. The refractory-metal atoms react with silicon atoms to form a refractory-metal silicide. This process is known in the art as a salicide process. A typical process sequence of the prior art for the fabrication of a silicided MOS device is illustrated in FIGS. 1 and 2.

FIG. 1 illustrates, in cross-section, a portion of a semiconductor substrate 10 having already undergone several process steps in accordance with the prior art. A field oxide region 12 defines an active region 14 in a semiconductor substrate 10. A gate electrode 16 of polycrystalline silicon overlies active region 14 and is separated therefrom by gate oxide layer 18. Insulating sidewall spacers 20 and 21 reside adjacent to the edges of gate electrode 16. After fabricating the gate electrode structure and forming the side wall spacers, a layer of refractory-metal 22 is deposited to overlie gate electrode 16, active region 14, and field oxide region 12.

Once the refractory-metal layer is deposited, an annealing process is carried out at a high temperature to form a refractory-metal silicide 24 in gate electrode 16, and a refractory-metal silicide 26 in active region 14. As shown in FIG. 2, the silicide-forming process results in an unevenly distributed silicide region within both gate electrode 16 and substrate 10. The uneven distribution of refractory-metal silicide is a result of a non-uniform diffusion of refractory-metal atoms into both the polycrystalline silicon material of gate electrode 16, and the single crystalline silicon material of substrate 10.

The non-uniform silicide regions, formed by fabrication processes of the prior art, result in a large variance in the electrical conductivity within the silicided regions. The non-uniform electrical conductivity can reduce the performance of an integrated circuit by causing the signal processing speeds to vary between components within the integrated circuit. The processing speed variance can lead to timing problems and result in slow or erratic signal processing within the integrated circuit. Accordingly, improvement in the fabrication of complex integrated circuits having refractory-metal silicide components is necessary to provide reliable, high-performance integrated circuits.

SUMMARY OF THE INVENTION

In practicing the present invention, there is provided a process for fabricating refractory-metal silicide layers in a semiconductor device. Electrically conductive device components are formed that include a diffusion barrier layer intermediate to a refractory-metal silicide and both polycrystalline silicon regions and a single crystal silicon regions. In one embodiment of the invention, a semiconductor substrate is provided having an active region therein and a gate dielectric layer overlying the active region. A first polycrystalline silicon layer is formed to overlie the gate dielectric layer. Then, a diffusion barrier is formed to overlie the first polycrystalline silicon layer. Next, a second polycrystalline silicon layer is formed to overlie the diffusion barrier layer. The second polycrystalline silicon layer is then converted to a refractory-metal silicide layer. During the conversion process, the diffusion barrier layer prevents the formation of the refractory-metal silicide in the first polycrystalline silicon layer. Additionally, in regions of the device where the diffusion barrier layer separates the second polycrystalline silicon layer from the substrate, the diffusion barrier layer also prevents the formation of a refractory-metal silicide in the substrate. By interposing a diffusion barrier layer between the second polycrystalline silicon layer and underlying silicon layers, a uniformly thick refractory-metal silicide region is formed in the second polycrystalline silicon layer.

Figure 1:
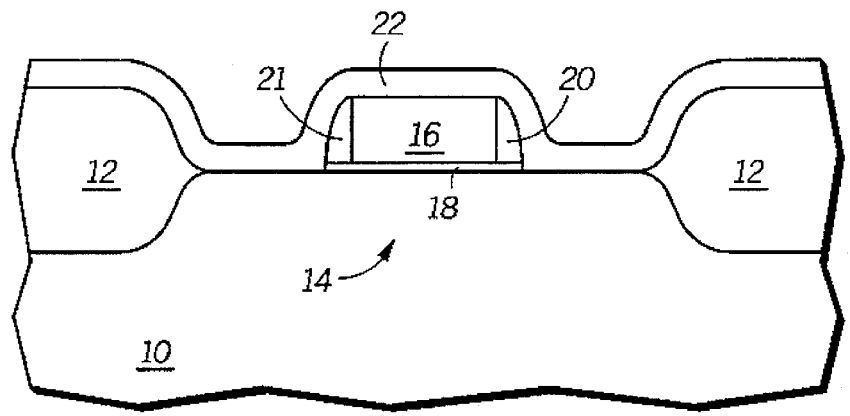
FIGS. 1–2 illustrate, in cross-section, process steps in accordance with the prior art for the fabrication of a refractory-metal silicide region in an MOS device.
Figure 2:
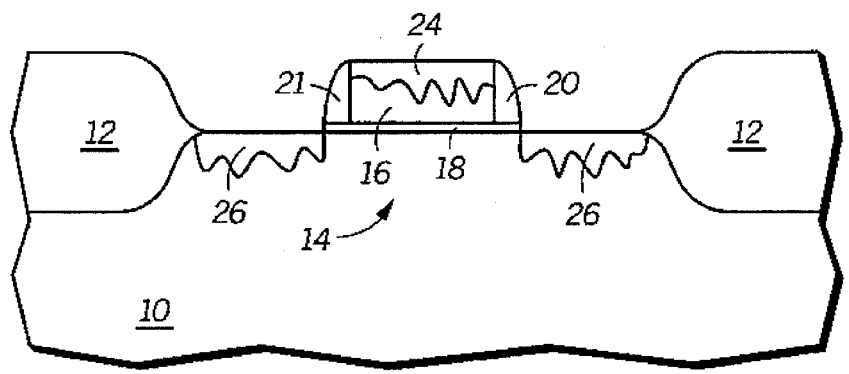

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The fabrication process of the present invention provides a uniformly-thick, refractory-metal silicide layer in electrically conductive elements of an integrated circuit. The process of the invention advantageously prevents the non-uniform formation of a refractory-metal silicide in a polycrystalline silicon layer by restricting the diffusion of refractory-metal atoms into underlying silicon regions. By interposing a diffusion barrier layer between the polycrystalline silicon layer and the underlying silicon regions, the diffusion of refractory-metal atoms is confined to the polycrystalline silicon layer initially exposed to the refractory-metal. The formation of a uniformly-thick refractory-metal silicide in conductive leads and gate electrodes of an integrated circuit improves the performance of the integrated circuit by providing uniform electrical resistance in the various components of the integrated circuit.

Figure 3:
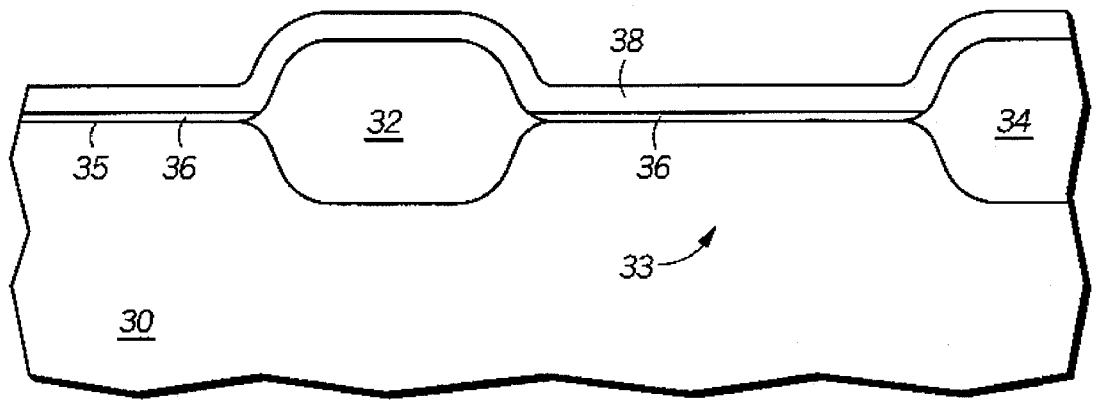
FIGS. 3–7 illustrate, in cross-section, process steps in accordance with the invention.

Shown in FIG. 3, in cross-section, is a portion of a semiconductor substrate 30 having already undergone several steps in accordance with the invention. Field oxide regions 32 and 34 are formed at a surface 35 of semiconductor substrate 30. Field oxide regions 32 and 34 define an active region 33 in substrate 30. Preferably, field oxide regions 32 and 34 are formed by a conventional isolation process, such as localized-oxidation-of-silicon (LOCOS). After field oxide regions 32 and 34 formed, an oxidation process is carried out to form a thin gate dielectric layer 36 overlying surface 35. Then, a first polycrystalline silicon layer 38 is formed to overlie gate dielectric layer 36 and field oxide regions 32 and 34.

At this point in the process, various doped regions can be formed in semiconductor substrate 30 by an implantation of dopant species through first polycrystalline silicon layer 38 and gate oxide layer 36. For example, a threshold adjustment implant can be performed to place dopant atoms at surface 35 in active region 33. Preferably, first polycrystalline silicon layer 38 is deposited as an undoped layer. Alternatively, first polycrystalline silicon layer 38 can be doped with a conductivity-determining dopant, such as phosphorous or arsenic. The doping process can be carried out either at the time of deposition, or immediately afterwards. Preferably, first polycrystalline silicon layer 38 is formed by a chemical vapor deposition process using a silane source gas.

Figure 4:
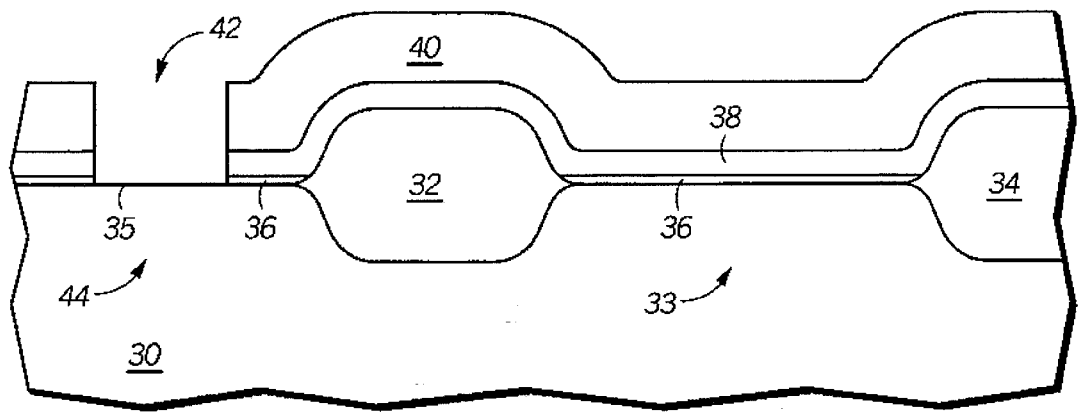

After first polycrystalline silicon layer 38 is deposited, a patterning process is carried out as illustrated in FIG. 4. A lithographic layer 40 is deposited onto first polycrystalline silicon layer 38. Lithographic layer 40 is exposed and developed to form a pattern on the surface of first polycrystalline silicon layer 38. Then, first polycrystalline silicon layer 38 and gate oxide layer 36 are anisotropically etched to form an opening 42. Preferably, a sequential anisotropic etching process is carried out to etch first polycrystalline silicon layer 38, and then gate dielectric layer 36. Preferably, chlorine-based etching chemistry is used to etch first polycrystalline silicon layer 38, and fluorine-based etching chemistry is used to selectively etch gate dielectric layer 36. The oxide etching process is carried out such that surface 35 of semiconductor substrate 30 remains substantially unetched. Opening 42 exposes a buried contact region 44 of semiconductor substrate 30.

Figure 5:
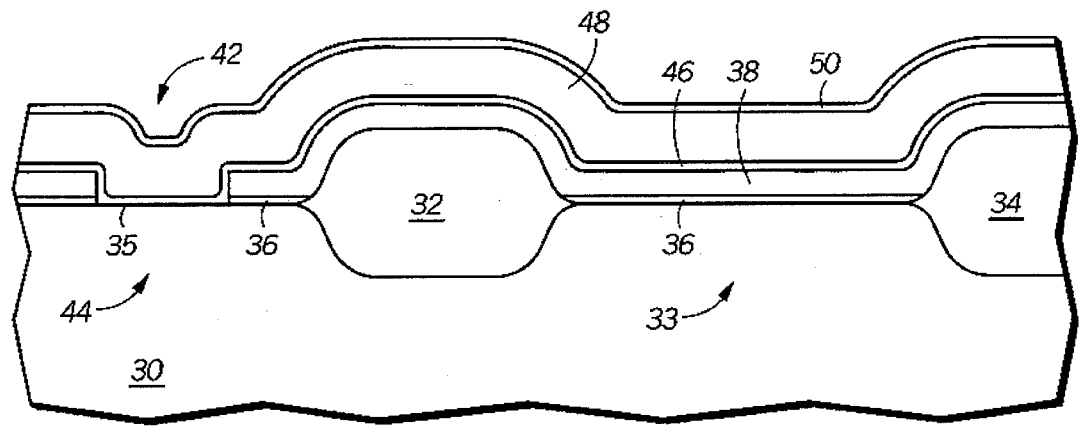

The inventive process continues with the formation of three separate conductive layers, as illustrated in FIG. 5. A diffusion barrier layer 46 is formed to overlie first polycrystalline silicon layer 38 and surface 35 at buried contact region 44. Preferably, diffusion barrier layer 46 is formed by the deposition of a layer of titanium nitride. The titanium nitride layer can be formed by reactive-ion-sputtering (RIS) or by chemical-vapor-deposition (CVD). Although the preferred diffusion barrier material is titanium nitride, other refractory-metals can be used, such as pure titanium, platinum, niobium, and the like. Also, intermetallic alloys of tungsten, platinum, and cobalt can be used. Additionally, the diffusion barrier material can be boron nitride. Furthermore, the diffusion barrier material can be a composite material formed by the RF sputter deposition of titanium followed by reactive ion sputtering or chemical vapor deposition of titanium nitride.

After forming diffusion barrier layer 46, a second polycrystalline silicon layer 48 is formed to overlie diffusion barrier layer 46. Preferably, second polycrystalline silicon layer 48 is formed by a chemical vapor deposition process to a thickness of about 500 to 2000 angstroms. The polycrystalline silicon is doped with a conductivity-determining dopant, such as phosphorus or arsenic. The doping process can be carried out either during the chemical vapor deposition process or immediately afterwards. The doping process saturates second polycrystalline silicon layer 48 with dopant atoms. Thus, the maximum degree of electrical conductivity which can be obtained by doping the polycrystalline silicon is achieved by saturating the polycrystalline silicon with the dopant species.

Following the formation of second polycrystalline silicon layer 48, a refractory-metal layer 50 is formed to overlie second polycrystalline silicon layer 48. Preferably, refractory-metal layer 50 is formed by the deposition of tungsten or titanium. The refractory-metal can be deposited by RF sputter deposition, or by chemical vapor deposition. Preferably, refractory-metal layer 50 is deposited to a thickness of about 400 to 1500 angstroms.

Figure 6:
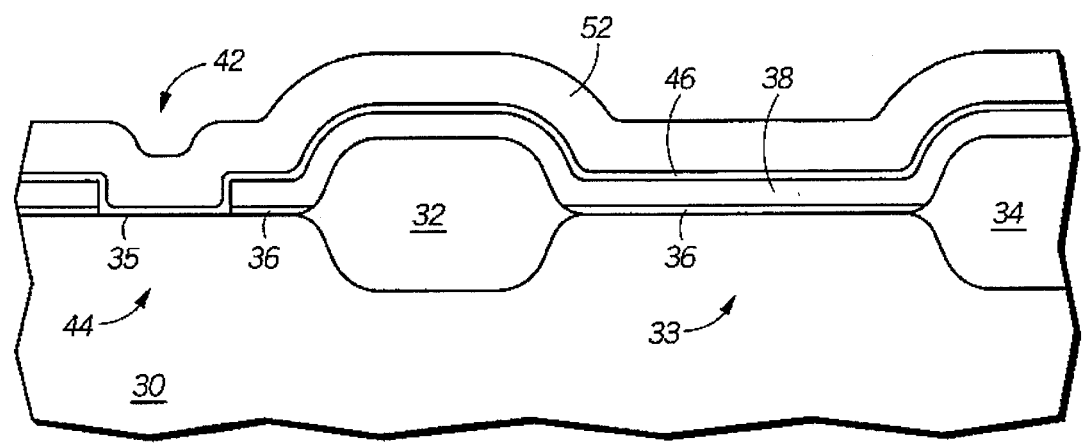

After forming refractory-metal layer 50, an annealing process is carried out to transform second polycrystalline silicon layer 48 and refractory-metal layer 50 into a single refractory-metal silicide layer 52, as illustrated in FIG. 6. Preferably, a rapid thermal annealing process is carried out at a temperature of about 650° to 800° C. for about 20 to 60 seconds. During the annealing process, refractory-metal atoms from refractory-metal layer 50 diffuse into second polycrystalline silicon layer 48 and react with silicon atoms to form the refractory metal silicide material. Diffusion barrier layer 46 prevents the diffusion of refractory-metal atoms into either first polycrystalline silicon layer 38 or semiconductor substrate 30.

The present invention also contemplates other methods for the formation of refractory-metal silicide layer 52. For example, refractory metal atoms can be introduced into second polycrystalline silicon layer 48 by molecular beam deposition, or by ion bombardment, or the like. Further, the reactions to form a refractory-metal silicide can be carried out by a rapid thermal annealing processes, and the like.

It is important to note that the presence of diffusion barrier layer 46 restricts the reaction of refractory-metal with silicon atoms to polycrystalline silicon provided by second polycrystalline silicon layer 48. By restricting the diffusion of refractory-metal atoms, the formation of refractory-metal silicide can only occur in second polycrystalline silicon layer 48. Accordingly, the inventive process produces a refractory-metal silicide having a uniform thickness across all regions of semiconductor substrate 30.

Figure 7:
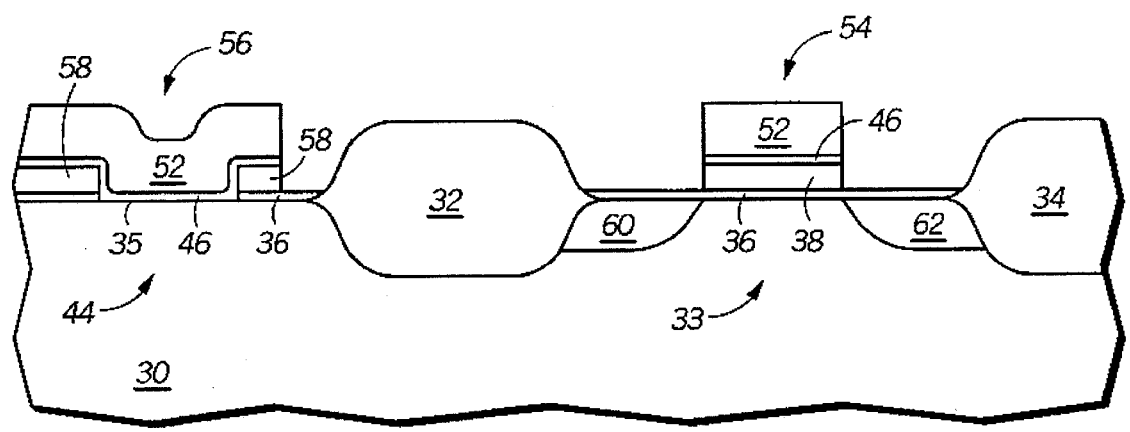

Once refractory-metal silicide layer 52 is formed, a lithographic patterning and anisotropic etching process are carried out to form the patterned, conductive components illustrated in FIG. 7. Upon completion of the etching process, a composite gate electrode 54 overlies active region 33, and a buried contact structure 56 overlies buried contact region 44.

Preferably, a sequential anisotropic etching process is used to form composite gate electrode 54 and buried contact structure 56. After forming a lithographic pattern (not shown), a refractory-metal silicide etching process is performed to etch refractory-metal silicide layer 52. Preferably, a plasma etching process is performed using the halogenated etching gases chlorine, hydrogen bromide, and nitrogen trifluoride. Initially, a fluorinated etching gas is introduced at a pressure of about 20 millitorr and RF power of about 400 watts is applied to strike a fluorine plasma. The fluorine plasma removes any native oxide material inadvertently formed on the surface of refractory-metal silicide layer 52. After removing the native oxide, the pressure is increased to about 100 millitorr and the RF power is reduced to about 225 watts. The refractory-metal silicide material is etched using a mixture of chlorine and hydrogen bromide gases.

The etching process is carried out until all of the refractory-metal silicide that has been exposed by the lithographic pattern (not shown) is removed. The end-point of the refractory-metal silicide etching process is detected by an end-point detection system in the plasma etching apparatus. It is important to note that the presence of diffusion barrier layer 46 provides a distinct optical end-point during the refractory-metal silicide etching process. Upon exposure of the diffusion barrier layer, as determined by optical endpoint detection, the refractory-metal silicide etching process is terminated.

The etching process and layer composition described herein offers improved processing over refractory-metal silicide structures of the prior art. Because a non-uniform refractory-metal silicide layer is formed by processes of the prior art, and because of the compositional similarity of silicide and polycrystalline silicon, it is difficult to detect the end-point when etching a refractory-metal silicide formed over polycrystalline silicon. The process of the present invention overcomes this difficulty by providing a diffusion barrier layer of distinctly different material composition from both refractory-metal silicide and polycrystalline silicon. Accordingly, in the processes of the invention, a well-defined optical end-point can be detected after removal of refractory-metal silicide and upon exposure of the diffusion barrier layer.

Once the refractory-metal silicide material is etched away, the etching process is changed to etch diffusion barrier layer 46. Preferably, diffusion barrier layer 46 is etched using chlorine-based etching gases. Finally, first polycrystalline silicon layer 38 is also etched using chlorine-based etching gases. The etching process selectively removes polycrystalline silicon and does not otherwise etch silicon dioxide material, such as gate oxide layer 36 and field oxide regions 32 and 34.

Upon completion of the sequential etching process, composite gate electrode 54 is fully formed and includes refractory-metal silicide layer 52, diffusion barrier layer 46, and first polycrystalline silicon layer 38. Buried contact structure 56 includes refractory-metal silicide layer 52, diffusion barrier layer 46, and residual portions 58 of first polycrystalline silicon layer 38. Both composite gate electrode 54 and buried contact structure 56 have high electrical conductivity, wherein composite gate electrode 54 and buried contact structure 56 exhibit a resistivity of about 15 micro-ohm-cm.

Those skilled in the art will appreciate that although composite gate electrode 54 and buried contact structure 56 are illustrated as independent components overlying semiconductor substrate 30, in certain integrated circuit device configurations, composite gate electrode 54 and buried contact structure 56 can be interconnected with each other. For example, in an SRAM memory cell, buried contact structure 56 can be a portion of a contact structure for cross-coupling the driver transistors of the SRAM memory cell.

After forming composite gate electrode 54, an ion implant process can be carried out to form source and drain regions 60 and 62, respectively, in active region 33. Additionally, it is within the scope of the present invention that a lightly-doped-drain (LDD) structure be formed in semiconductor substrate 30. This step can easily be performed by forming sidewall spacers (not shown) adjacent to the edges of composite gate electrode 54, then performing an ion implantation process using the sidewall spacers as a doping mask.

Thus it is apparent that there has been provided, in accordance with the invention, a process for fabricating refractory-metal silicide layers in a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different kinds of processing apparatus can be used, such as cluster-tool systems and electron-cyclotron resonance etching systems. Further, other lithographic techniques, such as deep UV lithography and X-ray lithography can be used. It is therefore intended to include within the invention all such variations and modifications as fall within the scope of the appended claims and equivalents thereof.

I claim:

1. A process for fabricating a semiconductor device comprising the steps of:

providing a semiconductor substrate having an active region therein and a gate dielectric layer overlying the active region;

forming a first polycrystalline silicon layer overlying the gate dielectric layer;

etching the first polycrystalline silicon layer and the gate dielectric layer to define a patterned layer;

forming a diffusion barrier layer overlying the patterned layer;

forming a second polycrystalline silicon layer overlying the diffusion barrier layer; and converting the second polycrystalline silicon layer to a refractory-metal silicide layer, wherein the diffusion barrier layer prevents formation of refractory-metal silicide in the first polycrystalline silicon layer.

2. The process of claim 1 further comprising the steps of:

sequentially etching the refractory-metal silicide layer, the diffusion barrier layer, and the patterned layer to form a gate electrode overlying the active region;

forming dielectric sidewall spacers adjacent to the gate electrode; and forming source and drain regions in the active region on either side of the gate electrode.

3. The process of claim 1 wherein the step of converting comprises the steps of:

depositing a layer of refractory-metal overlying the second polycrystalline silicon layer; and applying thermal energy to initiate a reaction between the refractory-metal and the second polycrystalline silicon layer.

4. The process of claim 1 wherein the step of forming a diffusion barrier comprises depositing a material selected from the group consisting of titanium nitride, boron nitride, and a bilayer of titanium and titanium nitride.

5. A process for fabricating a semiconductor device comprising the steps of:

providing a semiconductor substrate having a first and second active regions therein, and a gate dielectric layer overlying the first and second active regions;

forming a first polycrystalline silicon layer overlying the gate dielectric layer;

etching the first polycrystalline silicon layer and the gate dielectric layer to define a patterned layer and to expose a contact region at the first active region;

forming a diffusion barrier layer overlying the patterned layer and the contact region;

forming a second polycrystalline silicon layer overlying the diffusion barrier layer;

converting the second polycrystalline silicon layer to a refractory-metal silicide layer, wherein the diffusion barrier layer prevents formation of refractory-metal silicide in the first polycrystalline silicon layer and in the semiconductor substrate; and sequentially etching the second polycrystalline silicon layer, the diffusion barrier layer, and the patterned layer to form a gate electrode at the second active region and a buried contact structure at the first active region.

6. The process of claim 5, wherein the step of converting comprises the steps of:

depositing a layer of refractory-metal overlying the second polycrystalline silicon layer; and applying thermal energy to initiate a reaction between the refractory-metal and the second polycrystalline silicon layer.

7. A process for fabricating a semiconductor device comprising the steps of:

providing a semiconductor substrate having an active region therein and a gate dielectric layer overlying the active region;

forming a first polycrystalline silicon layer overlying the gate dielectric layer;

forming a diffusion barrier layer overlying the first polycrystalline silicon layer;

forming a second polycrystalline silicon layer overlying the diffusion barrier layer; and converting the second polycrystalline silicon layer to a refractory-metal silicide layer, wherein the diffusion barrier layer prevents the formation of refractory-metal silicide in the first polycrystalline silicon layer;

sequentially etching the refractory-metal silicide layer, the diffusion barrier layer, and the first polycrystalline silicon layer to form a gate electrode, wherein an end-point signal is detected upon exposure of the diffusion barrier layer during the sequentially etching.

8. The process of claim 7 wherein the step of forming a diffusion barrier comprises depositing a material selected from the group consisting of titanium nitride, boron nitride, and a bilayer of titanium and titanium nitride.

* * * * *